United States Patent [19]

Kurasaki et al.

[11] Patent Number: 5,013,400
[45] Date of Patent: May 7, 1991

[54] DRY ETCH PROCESS FOR FORMING CHAMPAGNE PROFILES, AND DRY ETCH APPARATUS

[75] Inventors: Howard S. Kurasaki, San Jose; Barbara F. Westlund, Saratoga; James E. Nulty, San Jose, all of Calif.; E. John Vowles, Deering, N.H.

[73] Assignee: General Signal Corporation, Stamford, Conn.

[21] Appl. No.: 472,327

[22] Filed: Jan. 30, 1990

[51] Int. Cl.$^5$ .................. H01L 21/312; B44C 1/22; C03C 15/00; C03C 25/06
[52] U.S. Cl. .................. 156/643; 156/644; 156/646; 156/651; 156/653; 156/657; 156/663; 156/345; 204/192.37; 204/298.34; 252/79.1
[58] Field of Search ............ 156/643, 644, 646, 651, 156/653, 657, 659.1, 662, 663, 345; 204/192.32, 192.35, 192.37, 298.34, 298.35; 252/79.1; 427/38, 39; 437/228, 233, 238

[56] References Cited

U.S. PATENT DOCUMENTS 4,776,918 10/1988 Otsubo et al. .................. 156/345
4,889,588 12/1989 Fior .................. 204/298.34 X

OTHER PUBLICATIONS

"Contact Hole and Via Profiling by High Rate Isotropic and Anisotropic Etching of Oxides", V. Grewal et al., Jun. 15–16, 1987 V-MIC Conf. 1987 IEEE.
"Silicon Dioxide Profile Control for Contacts and Vias", Leslie Giffen et al., Solid State Technology, Apr. 1989.
"Isotropic Plasma Etching of Doped and Undoped Silicon Dioxide for Contact Holes and Vias", W. G. M. van den Hoek, et al., J. Vac. Sci. Technol. A 7(3), May/Jun. 1989, pp. 670–675.
Waferetch ® Application Note, GCA Waferetch 606/616 Triode Etch Systems, data sheet, 1987 GCA Corporation, Plasma Systems Division.
Waferetch ® Application Note, Etching of Aluminum and Aluminum-Silicon 1986 GCA Corporation, Plasma Systems Division.
GCA Waferetch Application Note, Flexibility of Process Control with a Triode Etcher, E. Bogle-Rohwer, et al., 1987 GCA Corporation, Plasma Systems Division.

Primary Examiner—William A. Powell
Attorney, Agent, or Firm—Weingarten, Schurgin, Gagnebin & Hayes

[57] ABSTRACT

A two-step process for forming champagne profiles on semiconductor wafers that provide, when metallized, good reliability, microcracking-free contacts and vias is disclosed. Dry etch apparatus having electrodes in a triode configuration, two plasma forming regions, and a pressure control system operative to provide a wide setpoint pressure range is also disclosed.

33 Claims, 5 Drawing Sheets

DRY ETCH PROCESS FOR FORMING CHAMPAGNE PROFILES, AND DRY ETCH APPARATUS

FIELD OF THE INVENTION

The instant invention is directed to the field of semiconductor device fabrication, and more particularly, to an improved dry etch process for forming champagne profiles in semiconductor oxide layers, and to dry etch apparatus.

BACKGROUND OF THE INVENTION

In dry etch apparatuses and processes, one or more plasmas are caused to interact with suitably prepared surfaces of semiconductor or other materials to form one or more intended microstructures thereon. In one form of dry etch apparatus, the plasmas are controllably produced by two electrodes in a diode configuration, and in another form of dry etch apparatus, the plasmas are controllably produced by three electrodes in a triode or other three-electrode configuration. Selected etches corresponding to the intended microstructures being fabricated are effected by varying the applied electrode powers and relative spacings, and by varying the gas chemistries and other plasma control parameters, in a manner well known to those skilled in the art.

One important etch known to those skilled in the art is intended to allow its subsequent metallization as a contact or via. The smaller the dimensions of these contact holes and vias are to be, the more difficult it becomes to provide acceptable metallization. For physical dimensions of about a micron and less, typically called for in VLSI and other applications, the profiles of these etches must be carefully controlled or the subsequent metallization is subject to undesirable microcracking and metal fatigue that adversely impact the reliability of the contacts or vias.

An etch having a so-called "champagne" profile is able to provide microcracking-free contacts and vias when subsequently metallized, and such an etch has been produced by different dry etch apparatuses by a variety of different processes. In an article entitled "Contact Hole and Via Profiling by High Rate Isotropic and Anisotropic Etching of Oxides", by Grewal et al., appearing in the proceedings of an IEEE V-MIC Conference (June 1987), incorporated herein by reference, the use of a single wafer etcher from LAM-Research having electrodes in a diode configuration is reported to implement a two-step isotropic/anisotropic etch process to form such champagne profiles, and the use of the LAM-Research single wafer etcher to implement an isotropic etch followed by the use of an Applied Materials RIE hex etcher to implement an anisotropic etch is also reported to form these champagne profiles. For the two-step etch process implemented in the LAM-Research single wafer etcher, the electrode gap and gas chemistries were varied to first implement the isotropic step and then the anisotropic step. The gas chemistries for the isotropic etch were carbon tetrafluoride ($CF_4$) and oxygen ($O_2$), and the gas chemistries for the anisotropic etch implemented in the LAM-Research etcher and in the Applied Materials RIE hex etcher were a trifluoromethane ($CHF_3$) and oxygen ($O_2$) mixture.

In an article entitled "Silicon Dioxide Profile Control for Contacts and Vias", by Giffen et al., appearing at Solid State Technology (April 1989), incorporated herein by reference, the use of a Tegal 1513e single wafer etcher having top, side and bottom electrodes in a three-electrode configuration is reported to provide such champagne profiles. In one process mode reported therein, the wafer rests on the bottom electrode, which is powered, the side electrode is at floating potential, and the top electrode is grounded. Radio frequency (RF) power is pulsed to the bottom electrode for segregating ions and radicals in the induced plasma discharge, thereby etching photoresist isotropically while anisotropically etching oxide. In another reported process mode, the three electrodes are powered in such a manner that the oxide layer first is etched isotropically by powering the side electrode while holding the wafer electrode at floating potential, and then etched anisotropically. In the pulsed power process mode, the duty cycle, which controls the ratio of the anisotropic to the isotropic etch, controls the oxide slope, and nitrogen trifluoride ($NF_3$) was the primary etchant reported. For the isotropic/anisotropic process mode, different chemistries were used for the different tri-electrode RF power configurations, $NF_3$ for the isotropic etch and $SF_6/CHF_3$ for the anisotropic etch.

In an article entitled "Isotropic Plasma Etching of Doped and Undoped Silicon Dioxide for Contact Holes and Vias", by W. G. M. van den Hoek et al., appearing at J. Vac. Sci. Technol. A7 (3), (May/June 1989), incorporated herein by reference, the use of a Matrix System One etcher having two chambers separated by a grounded aluminum grid to implement an isotropic etch followed by the use of an AME 8110 hexode reactor to implement an anisotropic etch are reported for providing such champagne profiles. The isotropic etch in the Matrix System One etcher uses He and $NF_3$ gas chemistries, and the AME 8110 hexode reactor uses $CHF_3/CO_2/He$ gas chemistries.

Other diode and triode reactors are known, such as the model "384" diode reactor commercially available from the instant assignee, and the Waferetch 606/616 triode reactor, commercially available from GCA Corporation.

The utility of these heretofore known dry etch machines and/or processes has been limited either by an inability to form champagne profiles, or the etches that have been able to be formed thereby have suffered from less than desirable reproduceability, critical dimension control and/or, among others, resist erosion.

SUMMARY OF THE INVENTION

In accordance with one object of the present invention, a novel process is disclosed for fabricating champagne profiles in oxide layers previously applied to semiconductor or other wafers by a first plasma electrically and physically isolated from the wafer at a preselected comparatively-high pressure selected to provide a corresponding, comparatively-low mean free path to provide an isotropic etch, and thereafter by forming a second plasma electrically coupled and physically proximate the wafer at a preselected comparatively-low pressure selected to provide a corresponding, comparatively-high mean free path to provide an anisotropic etch. Both plasmas are formed in a single vessel. The champagne profiles fabricated thereby exhibit good critical dimension control, and reproduceability profile to profile, wafer to wafer and batch to batch, and when subsequently metallized, they allow to provide microcracking-free contacts and vias.

In accord with another object of the present invention, novel dry etch apparatus is disclosed that includes a reaction vessel in which three electrodes including a grid are mounted in a triode configuration to provide a first plasma forming region between one of the electrodes and the grid and a second plasma forming region between the grid and the other of the electrodes. A pressure control system is coupled to the reaction vessel for selecting pressure in the reaction vessel from a range of pressures that includes 50 mTorr to 3000 mTorr. An RF source is controllably coupled to the electrodes that cooperates with the pressure control system to selectively provide a first plasma only in the first plasma forming region that is electrically and physically isolated from the wafer at a preselected comparatively-high pressure selected to provide a comparatively-low mean free path, a second plasma only in the second plasma forming region that is physically proximate to and electrically coupled with the wafer at a preselected comparatively-low pressure selected to provide a comparatively-high mean free path, and a first and second plasma in the first and in the second plasma forming regions respectively. Selected reactant gases are introduced via a conduit coupled to one of the electrodes. Various temperature controllers are coupled to the electrodes, to the reaction vessel and to the region of the wafer electrode proximate the wafer for controlling the temperatures thereof.

BRIEF DESCRIPTION OF THE DRAWINGS

These and other objects, aspects, and advantages of the present invention will become apparent as the invention becomes better understood by referring to the following detailed description of the preferred embodiments thereof, and to the drawings, wherein:

FIG. 2 illustrates in FIG. 2A thereof a partially sectional and partially schematic view and illustrates in FIG. 2B thereof a partially pictorial and partially schematic view of the novel dry etch apparatus in accord with the present invention;

FIG. 4 shows in FIG. 4A and FIG. 4B thereof sectional views of the dry etch apparatus useful in explaining the process for forming champagne profiles in accord with the present invention.

DETAILED DESCRIPTION OF THE PREFERRED EMBODIMENTS

Figure 1:
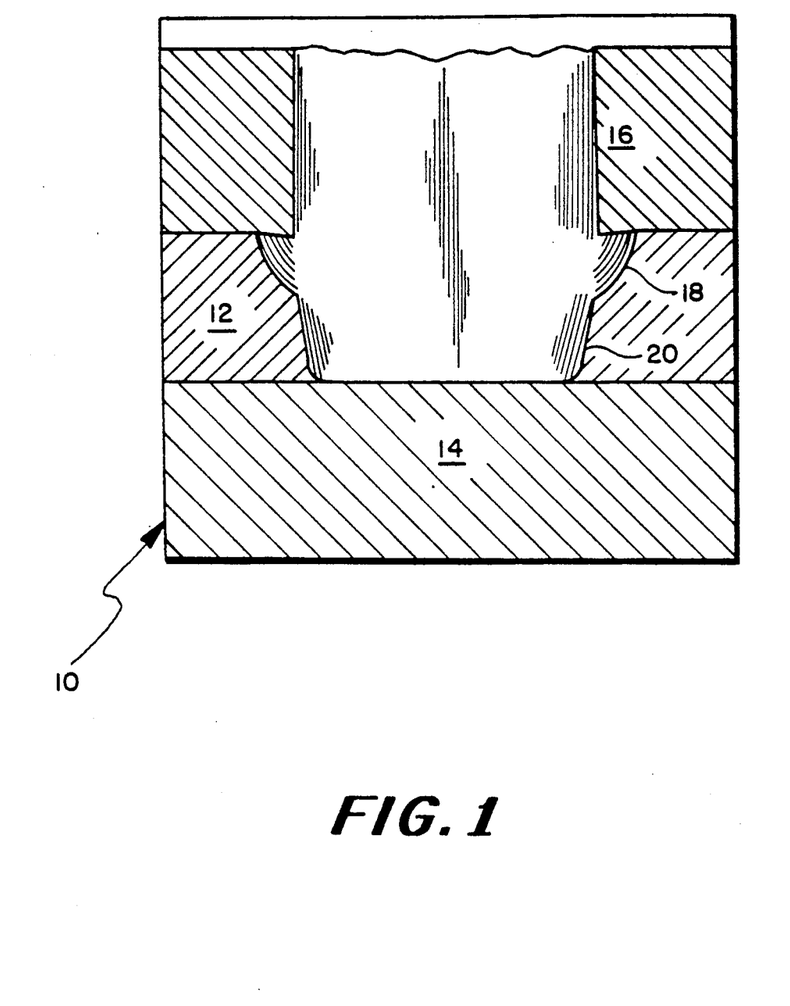
FIG. 1 is a drawing of a SEM picture illustrating an exemplary champagne profile of the type provided by the instant invention.

Referring now to FIG. 1, generally designated at 10 is a drawing of a SEM picture illustrating an exemplary champagne profile of the type provided by the instant invention. The profile 10 is formed in a manner to be described in an oxide layer generally designated 12, such as BPSG, previously applied to a semiconductor wafer or other substrate generally designated 14, at one or more predetermined locations thereof specified by a mask layer generally designated 16, such as photoresist, previously applied to the oxide layer 12. The champagne profile 10 includes a first curvilinear portion 18 isotropically etched in the oxide 12 by a first downstream plasma to be described, and a linear portion 20 anisotropically etched in the oxide 12 subjacent the portion 18 thereof by a second RIE plasma to be described. The etched profile 10, as constituted by the isotropically etched portion 18 and by the anisotropically etched portion 20, has been found to exhibit good critical dimension control and repeatability profile to profile, wafer to wafer and batch to batch, and when subsequently metallized, has been found to allow microcracking-free contacts and vias to be provided.

Figure 2A:
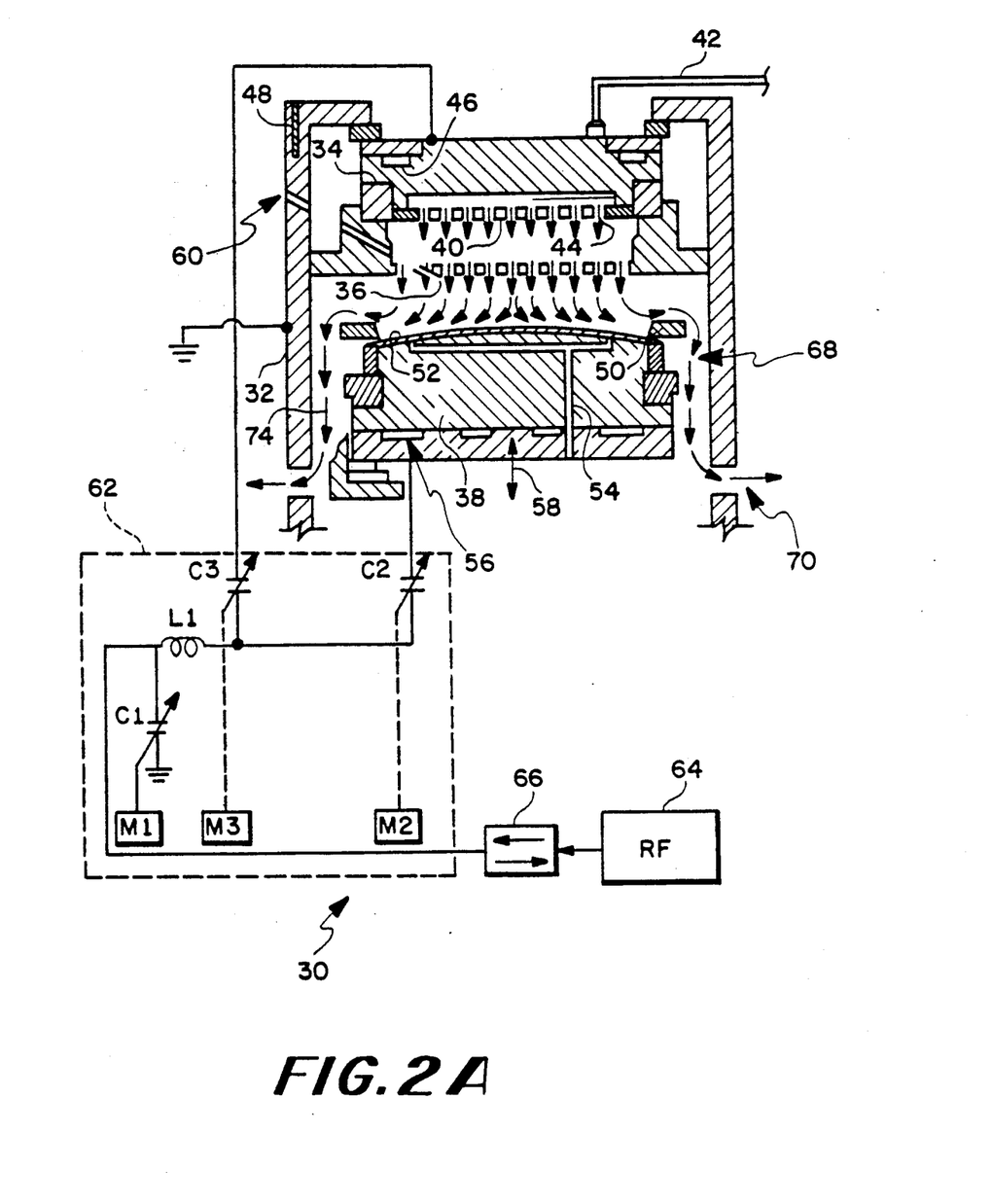

Referring now to FIG. 2A, generally designated at 30 is a partially sectional and partially schematic view illustrating the dry etch apparatus in accord with the present invention. The dry etch apparatus 30 includes a reaction vessel 32 into which an upper electrode 34, a grid 36, and a lower electrode 38 are mounted in spaced-apart relation in a triode configuration.

A diffuser 40 is mounted between the grid 36 and the upper electrode 34. Reactant gases, supplied by a reactant gas injection tube 42, are injected, through apertures, not shown, provided therefor in the upper electrode 34, into the reaction vessel 32, and are diffused by the diffuser 40 as schematically illustrated by arrows 44.

The upper electrode 34 has apertures generally designated 46 to allow the circulation of a heat transport fluid, such as water, thereinthrough to control the temperature of the upper electrode.

The vessel 32 is provided with bores into which resistive heating elements 48 are inserted to control the temperature of the reaction vessel.

A clamp ring 50 cooperates with the lower electrode 38 to releasably hold a wafer 52 therebetween.

The lower electrode 38 has apertures generally designated 54 confronting the wafer 52 to allow the circulation of a heat transport fluid, such as helium (He), thereinthrough to control the temperature of the wafer underside to both increase the rate of the isotropic oxide etch to be described and to minimize photoresist reticulation during the anisotropic oxide etch to be described.

The lower electrode 38 has apertures generally designated 56 to allow the circulation of a heat transport fluid, such as water, thereinthrough to control the temperature thereof.

A Z-actuator, not shown, is coupled to the lower electrode 38 for moving it towards and away from the upper electrode 34, as schematically illustrated by an arrow 58, to control the dimension of the gap therebetween.

An optical window generally designated 60 is provided through the vessel 32 to allow for optical emission end point determination of etch depth in a manner well known to those skilled in the art.

An automatic matching network illustrated by a dashed box 62 is electrically connected to the upper electrode 34 and to the lower electrode 38 for controllably coupling RF power thereto. The grid electrode 36 is electrically grounded. A radio frequency power source 64 is coupled via a bi-directional coupling 66 to the automatic matching network 62. The output of the bi-directional coupling 66 is coupled to ground via a variable capacitor marked "C1", and is applied through an inductor marked "L1" both to the lower electrode 38, through a circuit leg having a variable capacitor marked "C2" in series therewith, and to the upper electrode 34, through a circuit leg having a variable capacitor marked "C3" in series therewith. Motors respectively marked "M1", "M2" and "M3" control the capacitance of the variable capacitors "C1", "C2" and "C3" to selectively couple power to the upper and lower electrodes 34, 38 to selectively form a plasma only between the upper electrode 34 and the grid 36, a plasma only between the grid 36 and the lower electrode 38, and plasmas between the upper electrode and grid as well as between the grid and the lower electrode.

The dimensions of the inside wall of the vessel 32 and of the outside wall of the lower electrode 38 are such that an annular plenum generally designated 68 is provided therebetween. A portal generally designated 70 is provided through the vessel 32 in communication with the plenum 68 to exhaust injected reactant gases, as illustrated by arrows 74, and to allow selected internal chamber pressurization to be established and maintained.

Figure 2B:
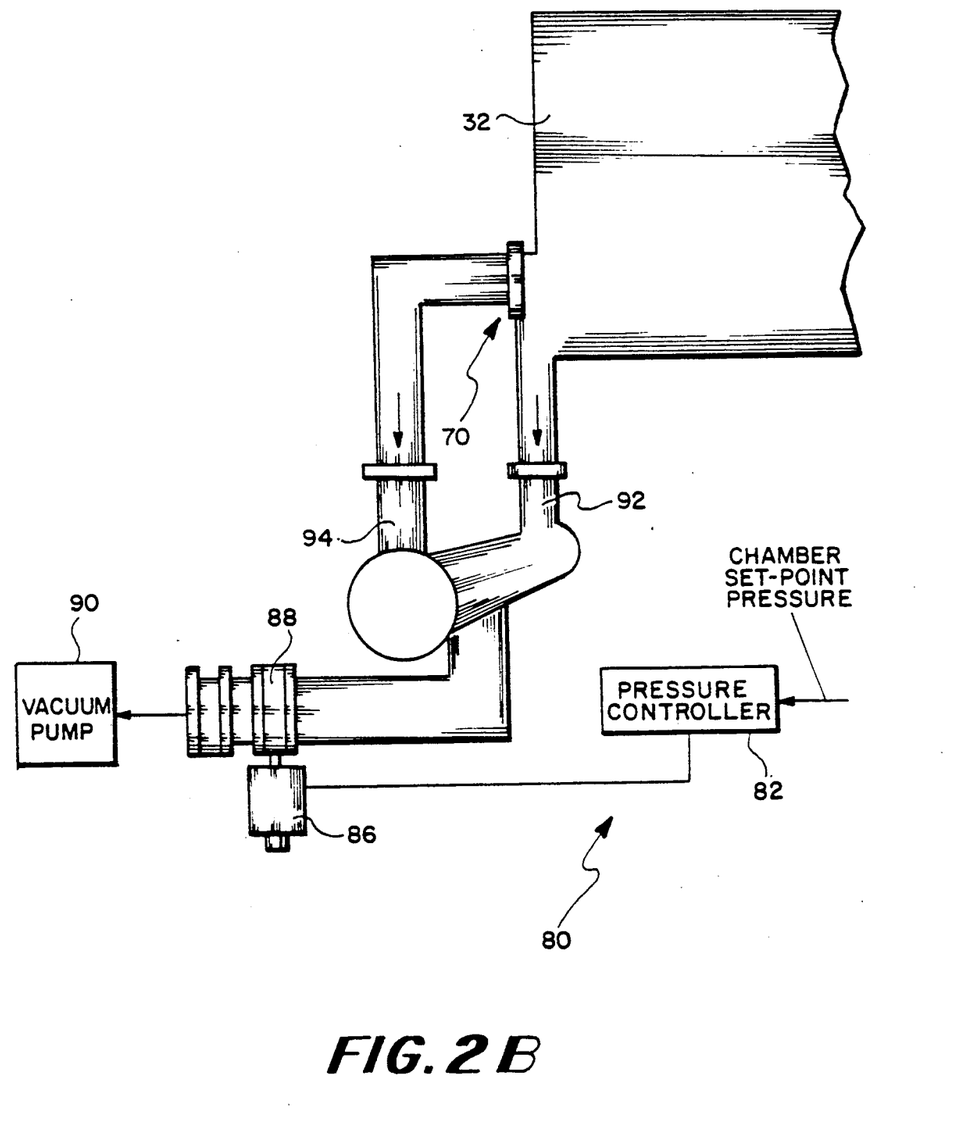

Referring now to FIG. 2B, generally designated at 80 is a partially pictorial and partially schematic diagram illustrating a pressure control system of the dry etch apparatus in accord with the present invention. The pressure control system 80 includes a pressure controller 82, that preferably includes feedback from a pressure manometer, not shown, positioned in the reaction vessel, responsive to a chamber setpoint pressure selected from a range of pressures that includes 50 mTorr to 3000 mTorr to control a motor 86. The motor 86 in turn controls the aperture size of a variable orifice throttle valve 88 connected between the portal 70 of the vessel 32 and a vacuum pump 90 along dual conduits 92, 94. In dependence on the chamber setpoint pressure selected, the motor 86 selects a particular aperture size for the variable orifice throttle valve 88, the particular size of which in turn enables the pump 90 to induce the corresponding setpoint pressure in the vessel 32 selected from the range of pressures that includes 50 mTorr to 3000 mTorr.

Figure 3:
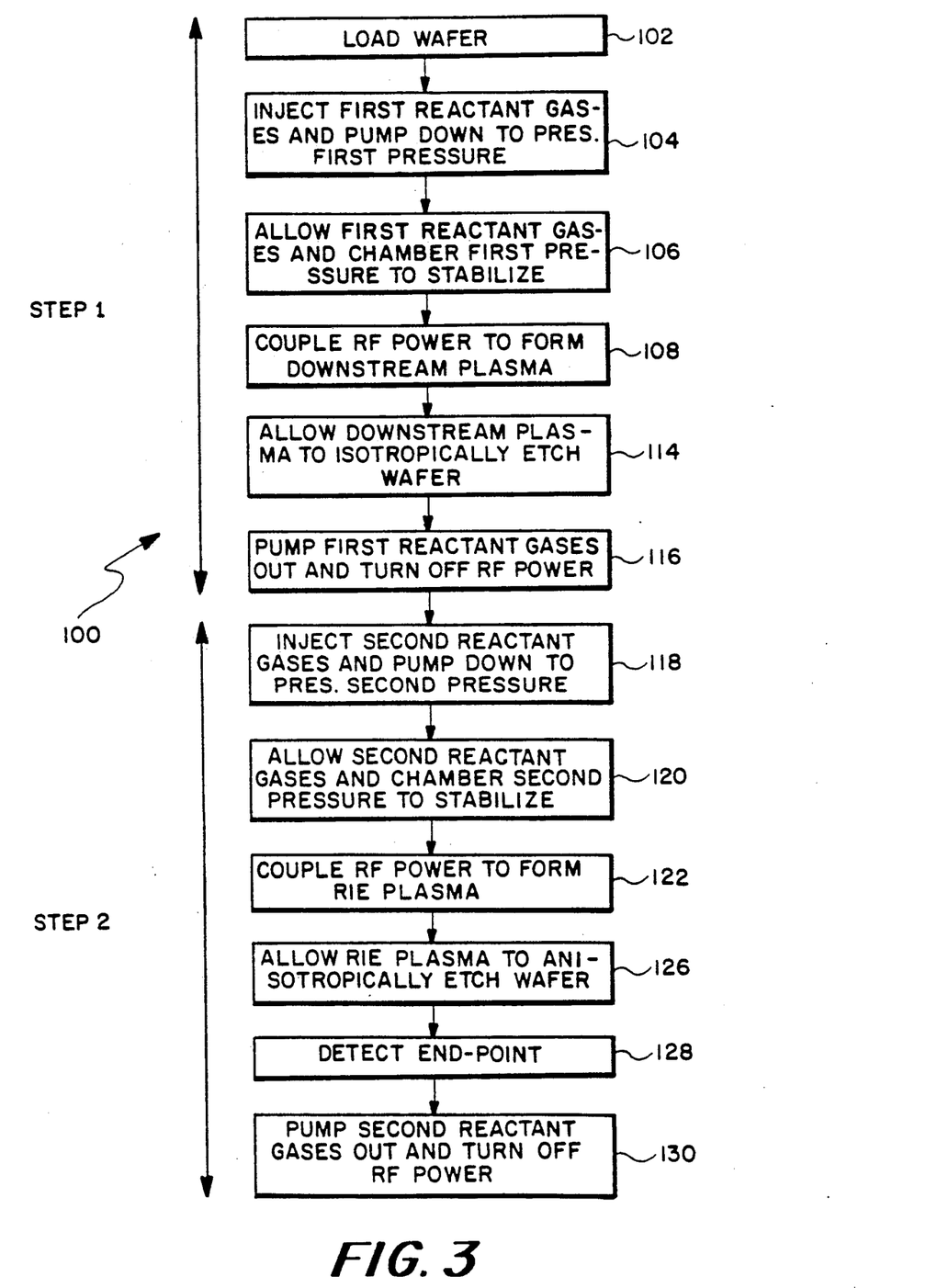
FIG. 3 is a block diagram illustrating the novel process for forming champagne profiles in accord with the present invention.

Referring now to FIG. 3, generally designated at 100 is a block diagram illustrating the novel process for forming champagne profiles in accord with the present invention. It should be noted that although in the preferred embodiment the process is implemented on the dry etch apparatus described above in connection with the description of FIG. 2, it could as well be practiced on any other suitable dry etch apparatus without departing from the inventive concept. In the illustrated process, 125 mm wafers were etched, but other wafer sizes including 100 mm to 200 mm wafers could be employed as well without departing from the inventive concept.

As shown by a block 102, a substrate such as a wafer to be etched is mounted on the lower electrode 38 (FIG. 2A) and held in position by the clamp ring 50 (FIG. 2A).

As shown by a block 104, first reactant gases, preferably $CF_4$ and $O_2$ are injected, preferably at 200 and 20 sccm, into the reaction chamber 32 (FIG. 2A) via the conduit 42 and the pressure in the chamber 32 (FIG. 2A) is set to a preselected first comparatively-high pressure by the pressure controller, controlled motor and throttle valve 82, 86, 88 (FIG. 2B). The range of flow rates for the $CF_4$ can be varied over the range including 150–500 sccm, and the flow rates for the $O_2$ can be varied over the ranges including 10 to 100 sccm. The first reactant gases $CF_4$ and $O_2$ are non-toxic and readily commercially available, and the preselected first comparatively-high pressure is preferably selected to be about 2200 mTorr. The preselected first comparatively-high pressure can be varied within the range that includes 1500 mTorr to 2500 mTorr, and good reliability, microcracking-free contacts and vias are still obtained when subsequently metallized. It is important that the preselected first comparatively-high pressure be selected to be greater than about 1000 mTorr, or such results cannot be obtained.

As shown by a block 106, a predetermined time is allowed to pass so that the first reactant gases and chamber first pressure stabilizes. This time typically is 10 seconds.

Figure 4A:
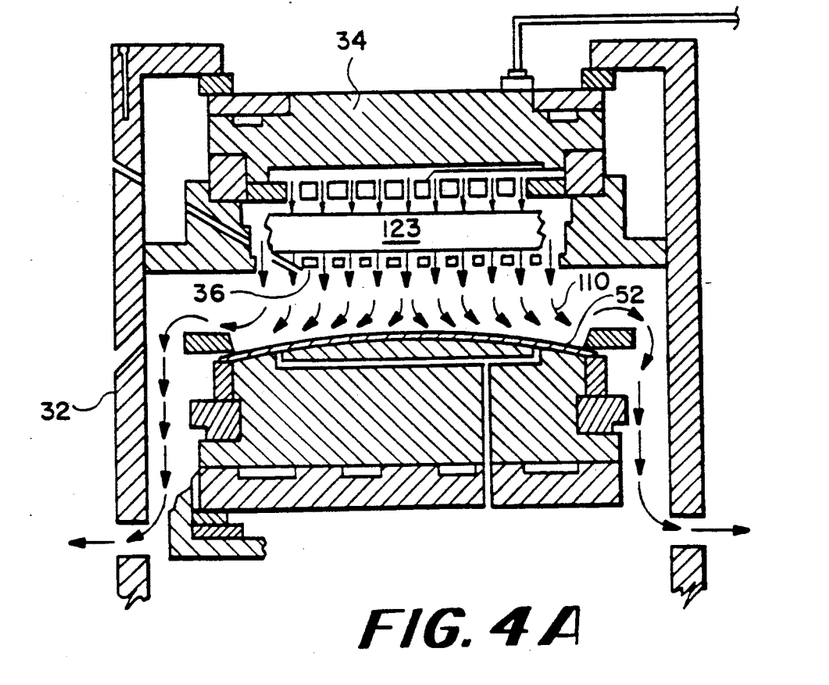

A shown by a block 108, immediately after the stabilization time has lapsed, the automatic matching network 62 couples radio frequency power only to the upper electrode 34 but not to the lower electrode, with the grid electrically grounded. In the preferred embodiment, 800 watts of radio frequency power at 13.56 MHz is applied thereby. The coupled radio frequency power induces a plasma generally designated 110 in FIG. 4A between the grid 36 and the upper electrode 34 only in the first plasma forming region of the vessel 32. The plasma 110, that includes charged and neutral species, is physically isolated from the wafer 52, and is electrically isolated therefrom by the grounded grid 36. Ions and other charged species are substantially contained in the first plasma forming region between the top electrode 34 and the grid 36 by the electrical isolation provided by the grounded grid and by the absence of any accelerating potential field emanating from the lower grid, thereby minimizing their contribution towards etching the wafer surface. The preselected first comparatively-high pressure, preferably 2200 mTorr, and corresponding comparatively-low mean free path between the charged and neutral species of the first plasma, maximizes the etching by the neutral species, and further minimizes the etching by the charged species. For the charged species, on the one hand, their comparatively-low mean free path is believed to deplete their energy, by collisional processes, thereby further reducing the ability of any charged species that do migrate through the grid to substantially etch the wafer. For the neutral species, on the other hand, which freely diffuse through the grid 36 and contact the wafer 52 as shown by arrows 112, their comparatively-low mean free path is believed to smooth out any overall directionality that the neutral species may have promoting thereby their isotropic etch capability.

As shown by a block 114, these neutral species of the plasma 108 are then allowed to isotropically etch the wafer for a predetermined time until the curvilinear portion 18 (FIG. 1) has been etched in the oxide, typically for 2.5 minutes in the preferred embodiment. In the preferred embodiment, the isotropic etch proceeds at the rate of about 2000 Å per minute.

As shown by a block 116, after the isotropic etch by the first plasma 110 is completed, the reactant gases are evacuated from the chamber 32 (FIG. 2A) by the pump 90 (FIG. 2B), and the radio frequency source 62 (FIG. 2A) is turned off.

As shown by a block 118, and after the isotropic etch has been completed and the first reactant gases have been pumped out, second reactant gases, preferably trifluoromethane ($CHF_3$) and perfluoroethane ($C_2F_6$) are injected into the vessel 32 (FIG. 2A) preferably at 114 sccm and 38 sccm, respectively, via the conduit 42 (FIG. 2A), and a preselected second comparatively-low setpoint pressure, preferably 130 mTorr, is established in the vessel 32 via the pressure controller, motor, and variable orifice valve 82, 86, and 88 (FIG. 2B). The range of flow rates for the $CHF_3$ can be varied over the range including 70 to 200 sccm, and the range of flow rates for the $C_2F_6$ can be varied over the range including 30 to 110 sccm. The preselected second comparatively-low pressure can be varied within the range that includes 100–400 mTorr, and good reliability, microcracking-free contacts and vias are still obtained when the champagne profiles are subsequently metallized.

As shown by a block 120, a predetermined time, typically 15 seconds, is allowed to lapse to allow the second reactant gases and chamber second pressure to stabilize.

Figure 4B:
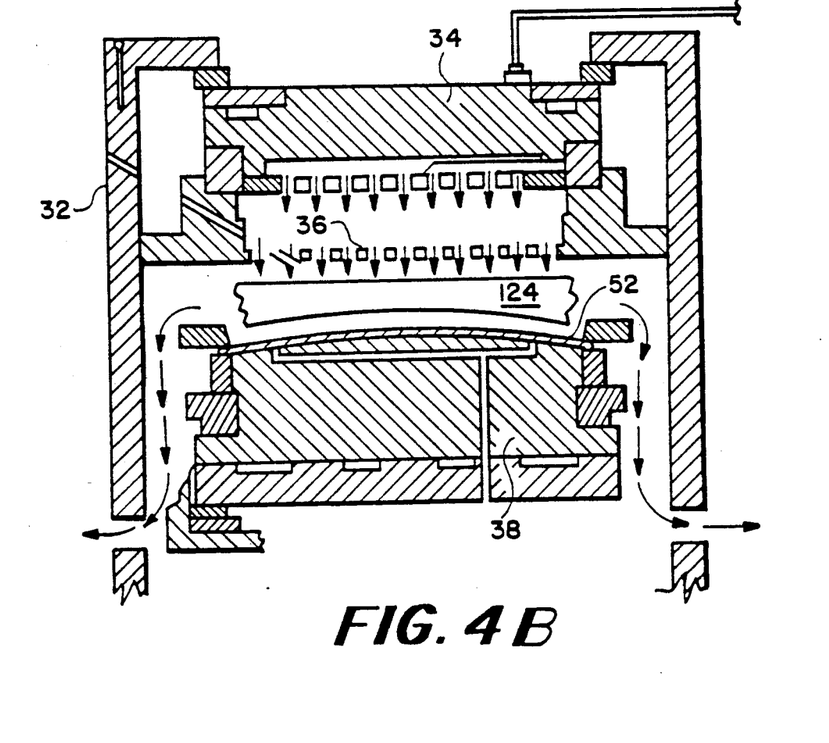

As shown by a block 122, immediately after this stabilization is completed, radio frequency power is coupled entirely to the lower electrode 38 but not to the top electrode (FIG.2A), preferably 500 watts at 13.56 MHz, with the grid grounded, forming a second plasma having charged and neutral species only in the second plasma forming region between the ground grid 36 and the lower electrode 38 that is generally designated at 124 in FIG. 4B. The plasma 124 is physically adjacent and electrically in contact with the surface of the the wafer 52. The power coupled to the lower electrode causes an electronic field to emanate therefrom that acts to proximity focus and accelerate the charged species theretoward in generally-straight trajectories. Other focusing techniques can be employed as well without departing from the inventive concept.

The preselected second comparatively-low pressure, preferably 130 mTorr, and corresponding, comparatively-high mean free path between the neutral and charged species is believed to maximize the etching by the charged species, by allowing them to be accelerated towards the lower electrode and to contact the prepared surface of the wafer with reduced collisional interference. The preselected second pressure can be selected from the range of pressures that includes 100 to 400 mTorr, and good reliability, microcracking-free contacts and vias are still obtained when subsequently metallized.

As shown by a block 126, the plasma ions and other charged species proximity focused by the electronic field emanating from the lower electrode 38 as they are accelerated towards the wafer are allowed to anisotropically etch the oxide 12 forming thereby the linear portion 20 (FIG. 1) of the champagne profile. In the preferred embodiment, the anisotropic etch proceeds at the rate from about 8,000 to 10,000 Å per minute.

As shown by a block 128, the second plasma is allowed to anisotropically etch the oxide of the wafer until a suitable depth has been achieved as detected by the optical emission end point detector. As show by a block 130, after the anisotropic etch by the second plasma has been completed, the second reactant gases are pumped out of the chamber and the radio frequency power is turned off. The preferred processing conditions for the first and second steps described in connection with the description of FIG. 3 are summarized in the following table.

|  |  | STEP 1 | STEP 2 |
|---|---|---|---|
| CF$_4$ | (sccm) | 200 |  |
| O$_2$ | (sccm) | 20 |  |
| CHF$_3$ | (sccm) |  | 114 |
| C$_2$F$_6$ | (sccm) |  | 38 |
| Pressure | (mTorr) | 2200 | 130 |
| RF Power | (Watts) | 800 | 500 |
| Power Split | (% RIE) | 0 | 100 |
| DC Bias Upper | (Volts) | −176 | . |
| DC Bias Lower | (Volts) |  | 800 |
| Etch Time | (mm:ss) | 2:00 | 1:00 |
| He Pressure | (Torr) | 4.0 | 12.0 |
| Temperature | (C) | 40 | 40 |
| Wafer size | (mm) | 125 | 125 |

Many modifications of the presently disclosed invention will become apparent to those skilled in the art without departing from the inventive concept.

What is claimed is:

1. A process forming champagne profiles in prepared surfaces of substrates that provide contacts and vias that are substantially microcracking-free when subsequently metallized, the champagne profiles having a first curvilinear profile portion and a second, subjacent linear profile portion, comprising the steps of:

releasably holding a substrate having a prepared surface to be etched in a reaction vessel of a dry etch machine;

injecting at least one first reactant gases at at least one preselected first flow rates into the reaction vessel of the dry etch machine;

pumping the reaction vessel to establish and maintain a preselected first comparatively-high pressure in the reaction vessel;

waiting a first time to allow the at least one preselected first flow rates and the preselected first comparatively-high pressure to stabilize;

controllably coupling first RF power into the reaction vessel to cause the at least one first reactant gases injected into the reaction vessel maintained at the preselected first comparatively-high pressure to form into a first plasma, having charged and neutral species that collide with correspondingly-low mean free paths in the reaction vessel, that is physically spaced from the wafer and electrically isolated therefrom in such a manner that the charged species are electronically and collisionally inhibited from etching the prepared surface of the substrate while the neutral species are allowed by a first mechanism to come into contact with the prepared surface of the substrate;

isotropically etching the prepared surface of the substrate with the contacting neutral species of the first plasma in a downstream mode to form said first curvilinear profile portion;

exhausting the at least one first reactant gases from the reaction vessel and decoupling the first RF power from the reaction vessel after the first curvilinear profile portion has been formed;

injecting at least one second reactant gases at at least one preselected second flow rates into the reaction vessel of the dry etch machine;

pumping the reaction vessel to establish and maintain a preselected second comparatively-low pressure in the reaction vessel;

waiting a second time to allow the at least one preselected second flow rates and the preselected second comparatively-low pressure to stabilize;

controllably coupling second RF power into the reaction vessel to cause the at least one second reactant gases injected into the reaction vessel maintained at the preselected second comparatively-low pressure to form into a second plasma, having charged and neutral species that collide with correspondingly-high mean free paths, in the reaction vessel that is physically proximate the wafer and electrically coupled thereto in such a manner that the charged species of the second plasma in the reaction vessel are caused to be accelerated towards the prepared surface of the substrate in generally straight trajectories with reduced collisional interferences by a preselected second mechanism;

anisotropically etching the prepared surface of the substrate with the charged species of the second plasma in a RIE mode to form said second linear profile portion; and exhausting the at least one second reactant gases from the reaction vessel and decoupling the second RF power from the reaction vessel after the second linear profile portion has been formed.

2. The process of claim 1, wherein the reaction vessel is provided with a first electrode, a grid and a second electrode defining a first plasma forming region between the first electrode and the grid, and a second plasma forming region between the grid and the second electrode;

wherein the substrate is releasably held proximate the second electrode;

wherein the at least one first reactant gases are injected in the first plasma forming region;

wherein the first RF power is coupled to the first electrode only and said grid is maintained at electrical ground so that said first plasma is formed in said first plasma forming region; and wherein said preselected first mechanism is diffusion.

3. The process of claim 1, wherein the at least one first reactant gases include carbon tetrafluoride and oxygen.

4. The process of claim 3, wherein the at least one preselected flow rates are selected from the range including 150 to 500 sccm for the carbon tetrafluoride and from the range including 10 to 100 sccm for the oxygen.

5. The process of claim 4, wherein the carbon tetrafluoride flow rate is 200 sccm and the $O_2$ flow rate is 20 sccm.

6. The process of claim 1, wherein said preselected first pressure is selected from the range of pressures including 1500 to 2500 mTorr.

7. The process of claim 6, wherein said pressure is selected to be 2200 mTorr.

8. The process of claim 1, wherein the reaction vessel is provided with a first electrode, a grid and a second electrode defining a first plasma forming region between the first electrode and the grid, and a second plasma forming region between the grid and the second electrode;

wherein the substrate is releasably held proximate the second electrode;

wherein the at least one second reactant gases are injected into the first plasma forming region;

wherein the second RF power is coupled to the second electrode only and said grid is maintained at electrical ground so that said second plasma is formed in said second plasma forming region; and wherein said preselected second mechanism is proximity focusing.

9. The process of claim 1, wherein said at least one second gases include $CHF_3$ and $C_2F_6$.

10. The process of claim 3, wherein said at least one preselected second flow rates are selected from the range including 70 to 200 sccm for the $CHF_3$ second reactant gas and the range including 30 to 110 sccm for the $C_2F_6$ second reactant gas.

11. The process of claim 10, wherein the $CHF_3$ flow rate is 114 sccm, and the $C_2F_6$ flow rate is 38 sccm.

12. The process of claim 1, wherein said preselected second pressure is selected from the range of pressures including 100 mTorr to 400 mTorr.

13. The process of claim 12, wherein said preselected second pressure is selected to be 130 mTorr.

14. A dry etch apparatus, comprising:

a reaction vessel;

first and second spaced-apart electrodes and a grid electrode therebetween mounted in the reaction vessel and defining a first plasma forming region between the first electrode and the grid and a second plasma forming region between the grid and the second electrode;

holding means for releasably holding a substrate proximate the second electrode;

gas injecting means cooperative with the first electrode for injecting reactant gases into the first plasma forming region;

an RF source;

coupling means connected between the RF source and the first and second electrodes and grid for controllably coupling the RF source selectively to the first and second electrodes and grid to selectively form a plasma in the first plasma forming region only, a plasma in the second plasma forming region only, and a plasma in both the first and the second plasma forming regions;

first temperature control means associated with the first electrode for circulating a heat transfer fluid through the first electrode to control its temperature;

second temperature control means associated with the second electrode for circulating a heat transfer fluid through the second electrode to control its temperature;

third temperature control means for circulating a heat transfer fluid proximate the surface of the second electrode confronting the wafer to control temperature of the wafer underside;

fourth temperature control means coupled to the reaction vessel to control temperature of the reaction vessel; and pressure control means for selectively establishing a preselected pressure in the reaction vessel selected over a range of pressures including 50 mTorr to 3000 mTorr.

15. The apparatus of claim 14, wherein the gas injection means includes a gas injection conduit coupled to the first electrode, walls defining flow paths in the first electrode for accepting gas fed thereto through the gas injection conduit and for releasing it into the first plasma forming region, and a diffuser mounted in the first plasma forming region for diffusing the injected reactant gases uniformly into the first plasma forming region.

16. The apparatus of claim 14, wherein said coupling means includes a circuit path coupled between the RF source and the first electrode and a circuit path coupled between the RF source and the second electrode, these circuit paths each having at least one reactive elements at least one of which has a variable reactance that is selectively variable to form the plasma in the first plasma forming region only, the plasma in the second plasma forming region only, and the plasmas in both the first and second forming regions.

17. The apparatus of claim 14, wherein said first and second temperature control means include walls respectively formed in the first and second electrodes to accept the heat transfer fluids thereinthrough.

18. The apparatus of claim 14, wherein said third temperature control means includes walls formed in said second electrode proximate the surface thereof confronting the wafer for circulating a helium (He) heat transfer transfer fluid thereinthrough.

19. The apparatus of claim 14, wherein said fourth temperature control means includes heating elements mounted in bores provided therefor in the reaction vessel.

20. The apparatus of claim 14, wherein the pressure control means includes a pump connected to a portal provided therefor in the reaction vessel via a pump conduit, and a variable orifice valve positioned in the pump conduit the size of the variable orifice of which corresponds to a set point pressure selected from the range of pressures to include 50 mTorr to 3000 mTorr.

21. The apparatus of claim 20, wherein said set point pressure is set by a pressure controller, and wherein the corresponding size of the variable orifice valve is set by a motor coupled between the pressure controller and the variable orifice valve.

22. A process forming champagne profiles having a first curvilinear portion and a subjacent second linear portion in oxide layers of semiconductor wafers comprising the steps of:

releasably holding a wafer in a reaction vessel;

forming a first plasma having charged and neutral species electrically and physically isolated from the wafer in the reaction vessel at a preselected comparatively-high first pressure and corresponding comparatively-low mean free path to both inhibit any etch by the charged species and to enhance isotropic etching by the neutral species;

isotropically etching the oxide layer thereof in a downstream mode for forming the first curvilinear portion of the champagne profiles with the neutral species;

extinguishing the first plasma after the first curvilinear portion has been formed;

forming a second plasma in the reaction vessel having charged and neutral species electrically coupled and physically proximate with the wafer at a preselected second comparatively-low pressure and corresponding comparatively-high mean free path to cause the charged species to be accelerated towards the oxide layers in generally straight trajectories to enhance anisotropic etching by the charged species;

anisotropically etching the oxide layers thereof in a RIE mode forming the second linear portion of the champagne profiles with the charged species; and extinguishing the second plasma after the second linear portion of the champagne profiles have been formed.

23. The process of claim 22, wherein said first preselected chamber pressure is selected to be a pressure from the range of pressures including 1500 to 2500 mTorr.

24. The process of claim 22, wherein the second preselected chamber pressure is selected from a range of pressures including 100 to 400 mTorr.

25. The process of claim 22, wherein the first plasma is formed by the steps including injecting carbon tetrafluoride ($CF_4$) and oxygen ($O_2$) reactant gases into the reaction vessel, and coupling RF power to the reactant gases.

26. The process of claim 22, wherein the second plasma is formed by the steps including injecting trifluoromethane ($CHF_3$) and perfluoroethane ($C_2F_6$) reactant gases into the reaction vessel, and coupling RF power to these reactant gases.

27. A process for fabricating champagne profiles in a layer previously applied to a substrate by the steps comprising:

controllably producing a first plasma bearing charged and neutral species in a reaction vessel and in such a manner that the first plasma is electrically and physically isolated from the substrate at a preselected comparatively-high pressure and corresponding comparatively-low mean free path in order to isotropically etch the layer primarily by the neutral species thereof; and thereafter producing a second plasma bearing charged and neutral species in the same reaction vessel and in such a manner that the second plasma is electrically coupled and physically proximate the wafer at a preselected comparatively-low pressure and corresponding comparatively-high mean free path in order to anisotropically etch the layer primarily by the charged species thereof.

28. The invention of claim 27, wherein the first plasma is produced by the steps including inducing $CF_4$ and $O_2$ to discharge as said first plasma.

29. The invention of claim 28, wherein said inducing step includes the step of flowing $CF_4$ and $O_2$ in gas-phase in the reaction vessel over a range of flow rates for the $CF_4$ including 150 to 500 sccm and for the $O_2$ including 10 to 100 sccm.

30. The invention of claim 29, wherein said preselected first comparatively-high pressure is selected from the range of pressures including 1500 to 2500 mTorr.

31. The invention of claim 27, wherein said second plasma is produced by the steps including causing $CHF_3$ and $C_2F_6$ to discharge as said second plasma.

32. The invention of claim 31, wherein said causing step includes the steps of flowing $CHF_3$ and $C_2F_6$ in gas-phase in the reaction vessel over a range of flow rates including 70 to 200 sccm for the $CHF_3$ and 30 to 110 sccm for the $C_2F_6$.

33. The invention of claim 32, wherein said preselected second comparatively-low pressure is selected from the range of pressures including 100 mTorr to 400 mTorr.

* * * * *